(12) United States Patent
Nishimura et al.

(10) Patent No.: US 8,383,517 B2
(45) Date of Patent: Feb. 26, 2013

(54) SUBSTRATE PROCESSING METHOD AND SUBSTRATE PROCESSING APPARATUS

(75) Inventors: Eiichi Nishimura, Nirasaki (JP); Chie Kato, Nirasaki (JP); Akitaka Shimizu, Nirasaki (JP); Hiroyuki Takahashi, Beverly, MA (US)

(73) Assignee: Tokyo Electron Limited, Tokyo (JP)

( * ) Notice: Subject to any disclaimer, the term of this patent is extended or adjusted under 35 U.S.C. 154(b) by 1182 days.

(21) Appl. No.: 12/023,491

(22) Filed: Jan. 31, 2008

(65) Prior Publication Data

US 2008/0182421 A1 Jul. 31, 2008

Related U.S. Application Data

(60) Provisional application No. 60/911,690, filed on Apr. 13, 2007.

(30) Foreign Application Priority Data

Jan. 31, 2007 (JP) ................................. 2007-021019

(51) Int. Cl.
*H01L 21/311* (2006.01)

(52) U.S. Cl. ........ 438/700; 438/702; 438/712; 438/717; 438/723

(58) Field of Classification Search .................. 438/700, 438/702, 712, 717, 723
See application file for complete search history.

(56) References Cited

U.S. PATENT DOCUMENTS

| 5,425,845 | A | 6/1995 | Wong | |
|---|---|---|---|---|
| 6,284,666 | B1* | 9/2001 | Naeem et al. | 438/713 |
| 2002/0094690 | A1* | 7/2002 | Athavale et al. | 438/710 |
| 2005/0151256 | A1* | 7/2005 | Natzle | 257/750 |
| 2006/0189064 | A1* | 8/2006 | Shim et al. | 438/210 |
| 2007/0026668 | A1* | 2/2007 | Tao et al. | 438/637 |
| 2007/0117406 | A1* | 5/2007 | Saito | 438/762 |
| 2007/0264842 | A1* | 11/2007 | Kim | 438/770 |

FOREIGN PATENT DOCUMENTS

| JP | 7-142443 | 6/1995 |
|---|---|---|
| JP | 2002-33313 | 1/2002 |

OTHER PUBLICATIONS

Office Action issued Jun. 1, 2011 in Japanese Patent Application No. 2007-021019 (with English translation).

* cited by examiner

*Primary Examiner* — Binh X Tran
(74) *Attorney, Agent, or Firm* — Oblon, Spivak, McClelland, Maier & Neustadt, L.L.P.

(57) ABSTRACT

A substrate processing method that can selectively remove deposit produced through dry etching of silicon. A substrate has a silicon base material and a hard mask that is made of a silicon nitride film and/or a silicon oxide film and formed on the silicon base material, the hard mask having an opening to which at least part of the silicon base material is exposed. A trench corresponding to the opening is formed in the silicon base material through dry etching using plasma produced from halogenated gas. After the dry etching, the substrate is heated to a temperature of not less than 200° C., and then hydrogen fluoride gas and helium gas are supplied toward the substrate.

9 Claims, 4 Drawing Sheets

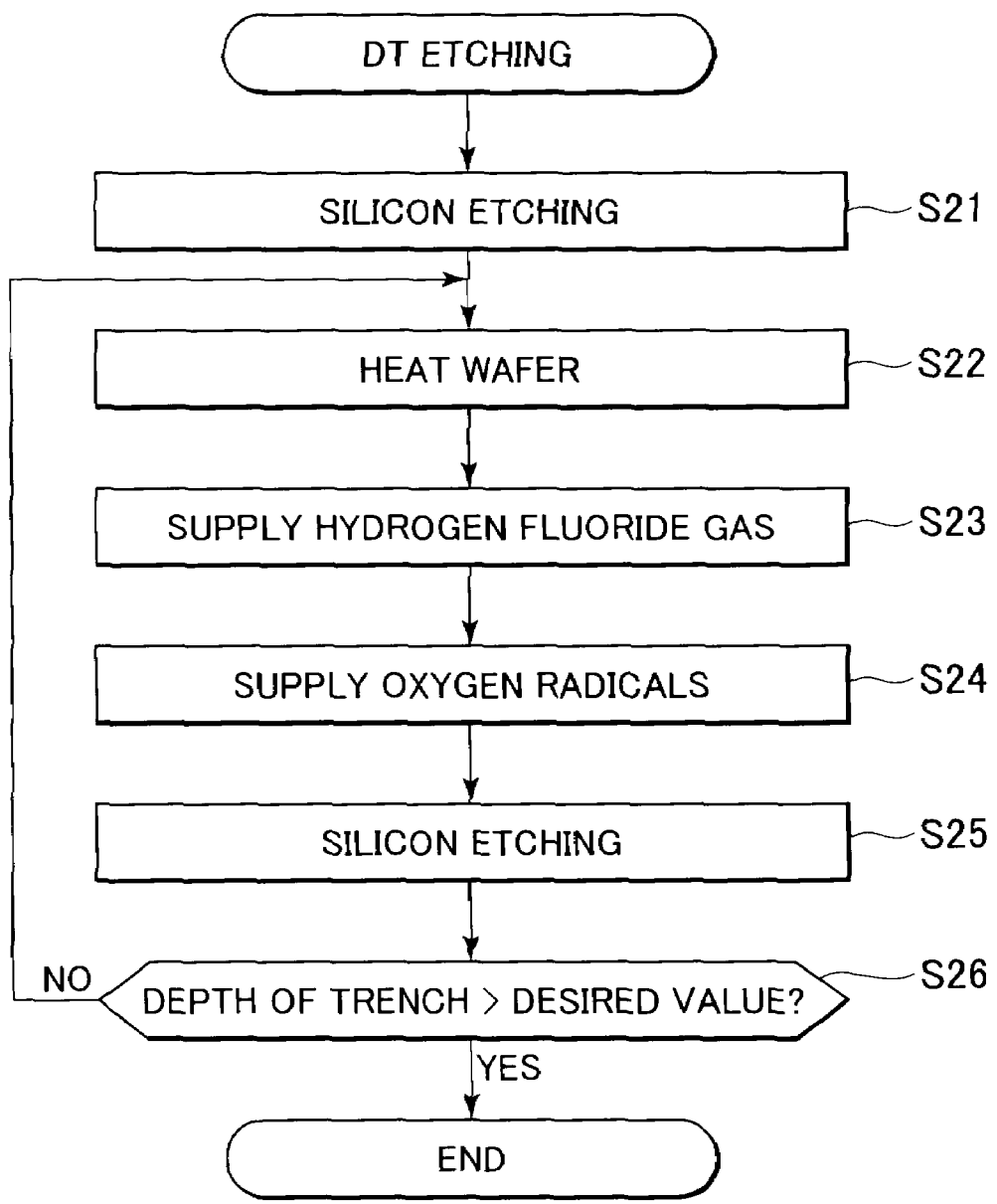

US 8,383,517 B2

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus, and in particular to a method of processing a substrate having a hard mask comprised of a silicon oxide film and/or a silicon nitride film.

2. Description of the Related Art

In the case of forming a trench or a hole in a silicon (Si) base material 40 of a semiconductor wafer (hereinafter referred to merely as a "wafer") W as a substrate that has the silicon base material 40 and a silicon nitride (SiN) film 41 formed on the silicon base material 40, the wafer W is subjected to dry etching using plasma 44 of halogenated gas such as hydrogen bromide (HBr).

In the dry etching, a hard mask 42 that is a film made of BSG (boron silicate glass) formed on the silicon nitride film 41 is used. The hard mask 42 has an opening 43 to which the silicon base material 40 is partially exposed. The plasma 44 enters the opening 43 and contacts the silicon base material 40 to physically or chemically etch the silicon base material 40 (FIG. 4A). As a result, a trench 45 corresponding to the opening 43 is formed in the silicon base material 40 (FIG. 4B).

However, during the dry etching described above, SiOBr produced through reaction of silicon and plasma of hydrogen bromide accumulates on a side face of the opening 43 and a side face of the trench 45 to form an SiOBr deposit portion 46. In particular, the amount of SiOBr accumulated on the side face of the opening 43 is large, and hence the SiOBr deposit portion 46 blocks most of the opening 43 and inhibits the entry of the plasma 44 into the trench 45. As a result, the etching of the silicon base material 40 stops, making it impossible to further deepen the trench 45.

To cope with this, as an example of a conventional method of removing the SiOBr deposit portion 46, a method in which the SiOBr deposit portion 46 is removed through wet etching using hydrofluoric acid has been developed (see, for example, Japanese Laid-Open Patent Publication (Kokai) No. 2002-33313). After the SiOBr deposit portion 46 is removed, the silicon base material 40 is etched again by the plasma 44.

However, in the wet etching using hydrofluoric acid, not only the SiOBr deposit portion 46 but also the hard mask 42 is removed. When the hard mask 42 is removed, part of the silicon base material 40 which does not correspond to the opening 43 becomes exposed, and the exposed part of the silicon base material 40 is etched, too, and hence the trench 45 becomes deformed, making it difficult to realize a desired aspect ratio of the trench 45.

SUMMARY OF THE INVENTION

The present invention provides a substrate processing method and a substrate processing apparatus that can selectively remove deposit produced through dry etching of silicon.

Accordingly, in a first aspect of the present invention, there is provided a method of processing a substrate having a silicon base material and a hard mask made of a silicon nitride film and/or a silicon oxide film and formed on the silicon base material, the hard mask having an opening to which the silicon base material is at least partially exposed, comprising a dry etching step of forming a concave portion corresponding to the opening in the silicon base material using plasma produced from halogenated gas, a heating step of heating the substrate to a temperature of not less than 200° C., and a gas supplying step of supplying hydrogen fluoride gas toward the substrate.

According to the first aspect of the present invention, the substrate in which the concave portion corresponding to the opening has been formed in the silicon base material through the dry etching using the plasma produced from hydrogen bromide is heated to a temperature of not less than 200° C., and the hydrogen bromide gas is supplied toward the substrate. When the substrate has reached a temperature of not less than 200° C., the hydrogen fluoride gas removes deposit produced through the dry etching of silicon, but does not remove the hard mask made of the silicon oxide film and/or the silicon nitride film. Thus, the deposit produced through the dry etching of silicon can be selectively removed.

The first aspect of the present invention can provide a method of processing a substrate, wherein the dry etching step is carried out again after the gas supplying step.

According to the first aspect of the present invention, the dry etching step is carried out again after the gas supplying step. Specifically, because the substrate is subjected to the dry etching after the deposit that blocks most of the opening corresponding to the trench is removed in the gas supplying step, the silicon base material can be etched again, and hence a deep trench (DT) can be formed in the silicon base material.

The first aspect of the present invention can provide a method of processing a substrate comprising an oxygen radical supplying step of supplying oxygen radicals toward the substrate before the dry etching step is carried out again after the gas supplying step.

According to the first aspect of the present invention, the oxygen radicals are supplied toward the substrate before the dry etching is carried out again after the gas supplying step. When the deposit is removed in the gas supplying step, the silicon base material becomes exposed on the side face of the trench. The oxygen radicals react with the exposed silicon base material to form an oxide film on the side face of the trench. The oxide film protects the side face of the trench from the plasma used in the dry etching that is carried out again. As a result, the trench can be prevented from becoming deformed.

The first aspect of the present invention can provide a method of processing a substrate, wherein a flow rate of the hydrogen fluoride gas supplied in the gas supplying step is 2000 sccm to 3000 sccm.

According to the first aspect of the present invention, because the flow rate of the hydrogen fluoride gas supplied in the gas supplying step is 2000 sccm to 3000 sccm, a sufficient amount of hydrogen fluoride gas can be supplied toward the substrate, and hence the deposit can be reliably removed.

The first aspect of the present invention can provide a method of processing a substrate, wherein a length of time that the hydrogen fluoride gas is supplied in the gas supplying step is not more than 30 seconds.

According to the first aspect of the present invention, the length of time that the hydrogen fluoride gas is supplied in the gas supplying step is not more than 30 seconds. The absolute amount of deposit produced in the dry etching of silicon is relatively small, and hence the deposit can be removed through etching using the hydrogen fluoride gas in a short time. Therefore, even if the length of time that the hydrogen fluoride gas is supplied is not more than 30 seconds, the deposit can be reliably removed.

The first aspect of the present invention can provide a method of processing a substrate, wherein deposit to be removed in the gas supplying step is deposit that is produced in the dry etching step and accumulates on a side face of the opening.

According to the first aspect of the present invention, because the deposit to be removed in the gas supplying step is deposit that is produced through the dry etching and accumulates on the side face of the opening of the hard mask, the path over which the plasma passes through the opening of the hard mask and enters the trench can be secured, and hence the deep trench can be reliably formed in the silicon base material.

Accordingly, in a second aspect of the present invention, there is provided a substrate processing apparatus that processes a substrate having a silicon base material and a hard mask made of a silicon nitride film and/or a silicon oxide film and formed on the silicon base material, the hard mask having an opening to which the silicon base material is at least partially exposed, and in which a concave portion corresponding to the opening is formed in the silicon base material through dry etching using plasma produced from halogenated gas, comprising a heating unit adapted to heat the substrate to a temperature of not less than 200° C., and a gas supplying unit adapted to supply hydrogen fluoride gas toward the substrate.

The features and advantages of the invention will become more apparent from the following detailed description taken in conjunction with the accompanying drawings.

BRIEF DESCRIPTION OF THE DRAWINGS

FIG. 2 is a flow chart of DT (deep trench) etching as a substrate processing method according to the present embodiment;

DETAILED DESCRIPTION OF THE PREFERRED EMBODIMENTS

The present invention will now be described in detail with reference to the drawings showing a preferred embodiment thereof.

First, a description will be given of a substrate processing apparatus according to an embodiment of the present invention.

Figure 1:
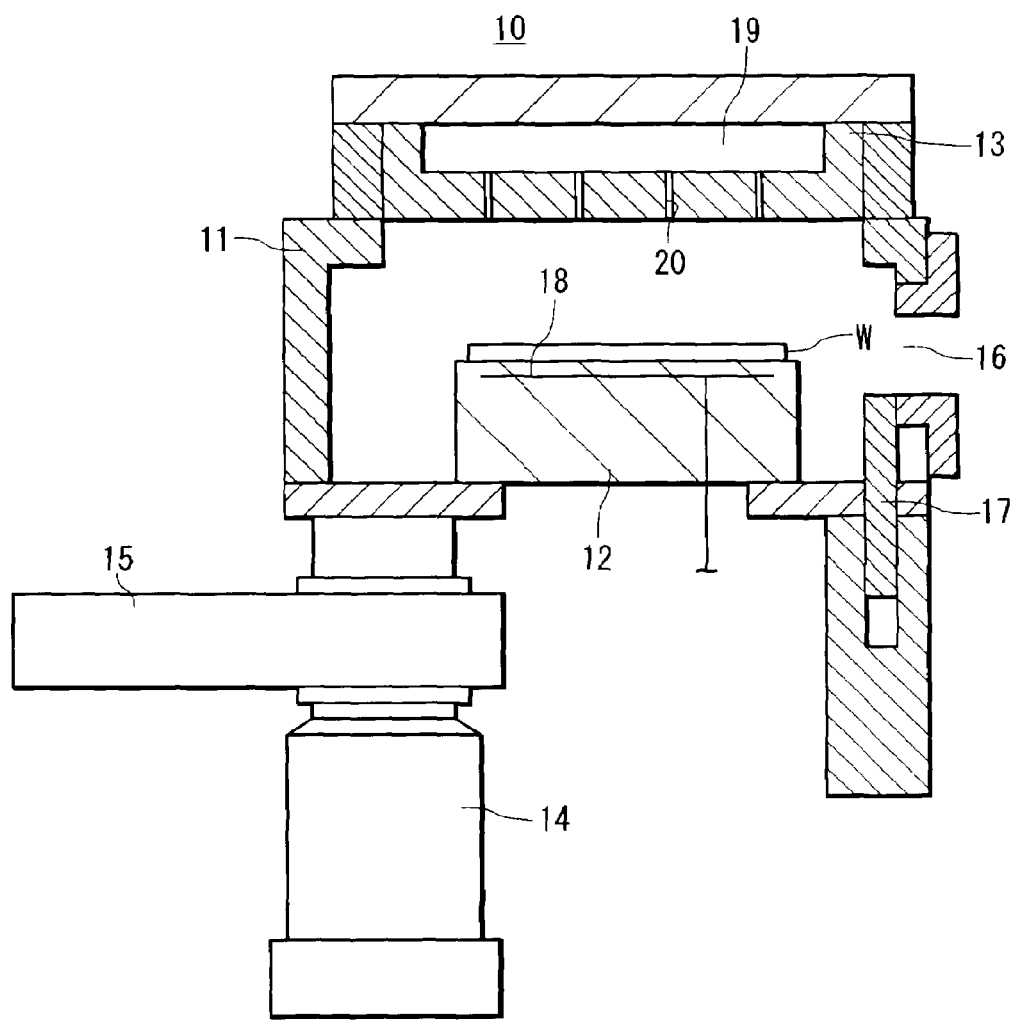
FIG. 1 is a sectional view schematically showing the construction of a substrate processing apparatus according to an embodiment of the present invention.

FIG. 1 is a sectional view schematically showing the construction of the substrate processing apparatus according to the present embodiment.

Figure 4A:
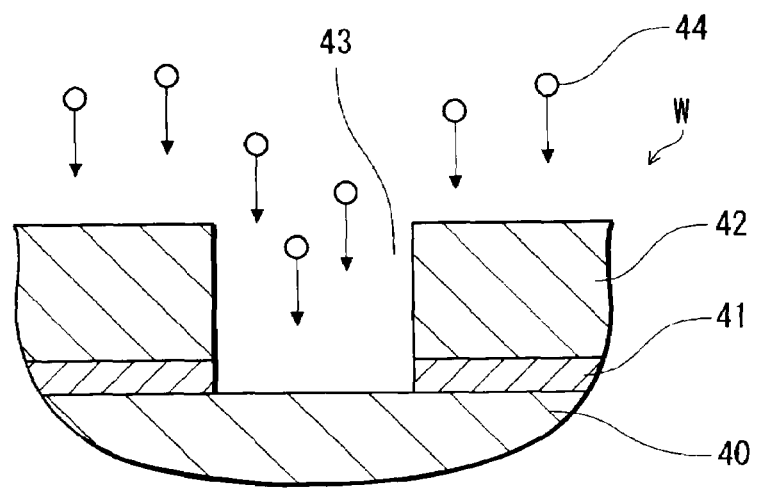
FIGS. 4A and 4B are process drawings showing a conventional process of forming a trench in a silicon base material of a semiconductor wafer.

As shown in FIG. 1, the substrate processing apparatus 10 has a wafer housing chamber (hereinafter referred to merely as the "chamber") 11 in which a wafer W (substrate) in FIG. 4A is housed, a mounting stage 12 that is disposed in the chamber 11 and on which the wafer W is mounted, a shower head 13 (gas supplying unit) that is disposed in an upper portion of the chamber 11 such as to face the mounting stage 12, a TMP (turbo-molecular pump) 14 that exhausts gas and the like out of the chamber 11, and an APC (adaptive pressure control) valve 15 that is disposed between the chamber 11 and the TMP 14 as a variable butterfly valve for controlling the pressure in the chamber 11.

The chamber 11 is a housing chamber having a side wall, a ceiling portion, and a bottom portion made of aluminum or the like. A transfer port 16 for transferring the wafers W is provided in the side wall of the chamber 11. The transfer port 16 is opened and closed by a sliding gate 17.

The mounting stage 12 is comprised of a cylindrical aluminum member, and the diameter thereof is set to be larger than that of the wafer W. Thus, when the wafer W is mounted on the mounting stage 12, the entire rear surface of the wafer W contacts an upper surface (mounting surface) of the mounting stage 12. The mounting stage 12 has a heater (heating unit) 18 therein. The heater 18 is disposed parallel to the mounting surface of the mounting stage 12. When the heater 18 generates heat, the whole wafer W is uniformly heated because the entire rear surface of the wafer W contacts the mounting surface. It should be noted that the heater 18 is able to heat the mounted wafer W to a temperature of not less than 200° C.

The shower head 13 is comprised of a disk-shaped aluminum member and has a buffer chamber 19 therein. The buffer chamber 19 communicates with the interior of the chamber 11 via a plurality of gas vent holes 20. The buffer chamber 19 of the shower head 13 is connected to a hydrogen fluoride (HF) gas supply system (not shown) and a helium (He) gas supply system (not shown). The hydrogen fluoride gas supply system supplies hydrogen fluoride gas into the buffer chamber 19, and the helium gas supply system supplies helium gas into the buffer chamber 19. The supplied hydrogen fluoride gas and helium gas are supplied into the chamber 11 and further toward the wafer W via the gas vent holes 20.

In the substrate processing apparatus 10, the side wall of the chamber 11 also has a heater (not shown), for example a heating element, incorporated therein. The heating element inside the side wall of the chamber 11 prevents $SiF_4$ (silicon tetrafluoride) or the like, described later, subliming from the wafer W from becoming attached to an inner side of the side wall.

Figure 4B:
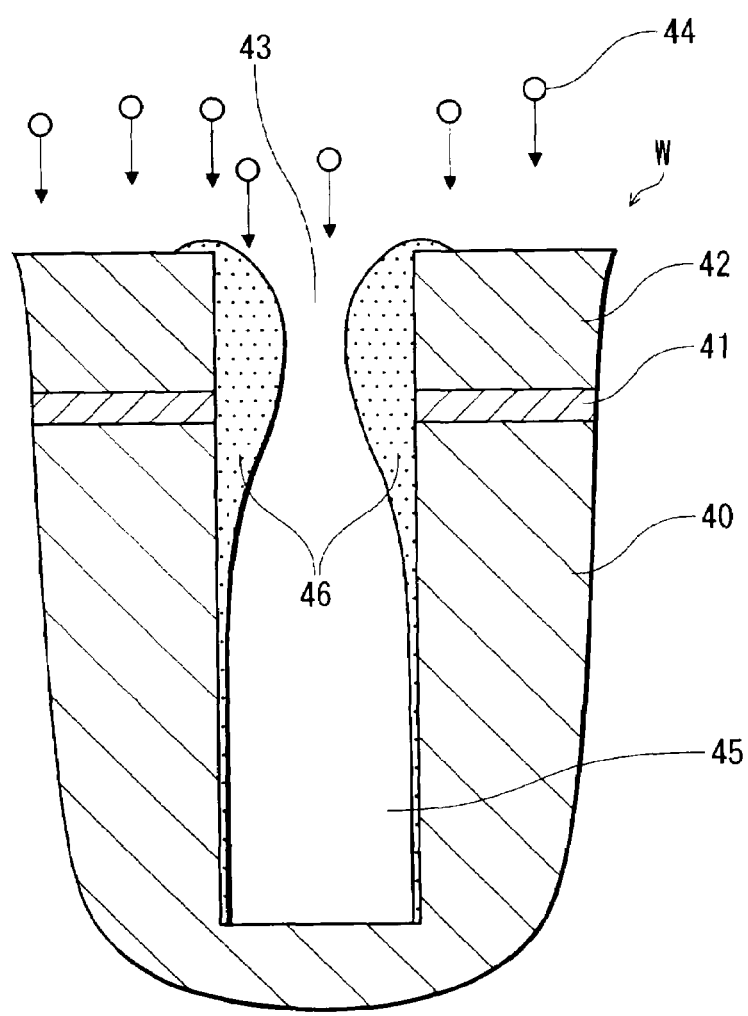

The present inventors conducted various experiments on the wafer W in FIG. 4B so as to find a method of selectively removing only the SiOBr deposit portion 46 without carrying out wet etching using hydrofluoric acid, and found that etching of the hard mask 42 made of BSG and the silicon nitride film 41 using hydrogen fluoride gas is clearly temperature-dependent.

Specifically, the present inventors found that in etching of the hard mask 42 and the silicon nitride film 41 using hydrogen fluoride gas, if the temperature of the wafer W is changed to 200° C. or higher, the etch rate for the hard mask 42 and the silicon nitride film 41 becomes zero. The present inventors also found that even when the temperature of the wafer W is not less than 200° C., the etch rate for the SiOBr deposit portion 46 does not become zero, and the SiOBr deposition portion 46 is etched by hydrogen fluoride gas. In this case, the flow rate of hydrogen fluoride gas supplied from the shower head 13 toward the wafer W was 2000 sccm to 3000 sccm, the flow rate of helium gas supplied from the shower head 13 toward the wafer W was 100 sccm to 1000 sccm, and the pressure in the chamber 11 was set to $6.67 \times 10^2$ Pa (5 Torr) to $2.67 \times 10^3$ Pa (20 Torr). The present invention has been developed based on these findings.

It is difficult to clearly explain the reason why the etch rate for the hard mask 42 and the silicon nitride film 41 is nearly zero but the etch rate for the SiOBr deposit portion 46 does not become zero when the temperature of the wafer W is not less than 200° C., but the present inventors arrived at the following hypothesis.

The hard mask 42, the silicon nitride film 41, and the SiOBr deposit portion 46 contain water molecules. Hydrogen fluoride gas that has reached the hard mask 42 and the SiOBr deposit portion 46 combines with the contained water molecules to make hydrofluoric acid. The hard mask 42 is composed mainly of a silicon oxide, and SiOBr is a pseudo-silicon oxide. The hydrofluoric acid chemically reacts with these silicon oxides as expressed by the following equation (1):

$$SiO_2 + 4HF \rightarrow SiF_4 + 2H_2O\uparrow \qquad (1)$$

The $SiF_4$ produced through the chemical reaction expressed by the above equation (1) chemically reacts with the hydrofluoric acid as expressed by the following equation (2) to make residue ($H_2SiF_6$):

$$SiF_4 + 2HF \rightarrow H_2SiF_6 \qquad (2)$$

The residue causes a conduction error and the like of a semiconductor device and hence has to be removed from the wafer W. However, if the wafer W has been heated by the heater 18, the residue is thermally decomposed through thermal energy as expressed by the following equation (3):

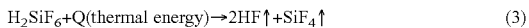
$$H_2SiF_6 + Q(\text{thermal energy}) \rightarrow 2HF\uparrow + SiF_4\uparrow \qquad (3)$$

Moreover, hydrogen fluoride gas that has reached the silicon nitride film 41 combines with the contained water molecules to make hydrofluoric acid. The hydrofluoric acid then chemically reacts with the silicon nitride film 41 as expressed by the following equation (4):

$$2\ SiN + 8HF \rightarrow 2SiF_4 + 4H_2\uparrow + N_2\uparrow \qquad (4)$$

The $SiF_4$ produced through the chemical reaction expressed by the above equation (4) is also decomposed through the chemical reaction expressed by the above equations (2) and (3).

As described above, the silicon nitride film 41, the hard mask 42, and the SiOBr deposit portion 46 are etched by the hydrogen fluoride gas.

However, the hard mask 42 and the silicon nitride film 41 are formed through film formation processing such as CVD (chemical vapor deposition) processing, while the SiOBr deposit portion 46 is formed through accumulation of SiOBr. Thus, the structure of the SiOBr deposit portion 46 is much looser as compared with the film structures of the hard mask 42 and the silicon nitride film 41 and hence contains a large amount of water molecules.

Here, if the wafer W is heated to a temperature of not less than 200° C. by the heater 18, the water molecules of the hard mask 42 and the silicon nitride film 41 evaporate and hence do not make hydrofluoric acid even when the hydrogen fluoride gas reaches the hard mask 42 and the silicon nitride film 41. As a result, the hard mask 42 and the silicon nitride film 41 are not etched by hydrofluoric acid. On the other hand, because the SiOBr deposit portion 46 contains a large amount of water molecules, even if the wafer W is heated to a temperature of not less than 200° C., water molecules remain in the SiOBr deposit portion 46, and the remaining water molecules combine with the hydrogen fluoride gas to make hydrofluoric acid. As a result, the SiOBr deposit portion 46 is etched by the hydrofluoric acid.

Next, a description will be given of a substrate processing method according to the present embodiment.

FIG. 2 is a flow chart of DT (deep trench) etching as the substrate processing method according to the present embodiment.

Figure 3A:
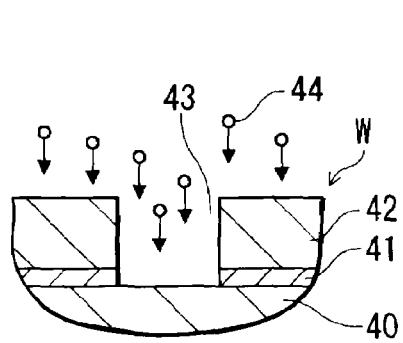
FIGS. 3A to 3E are process drawings showing a process of the DT etching.
Figure 3B:
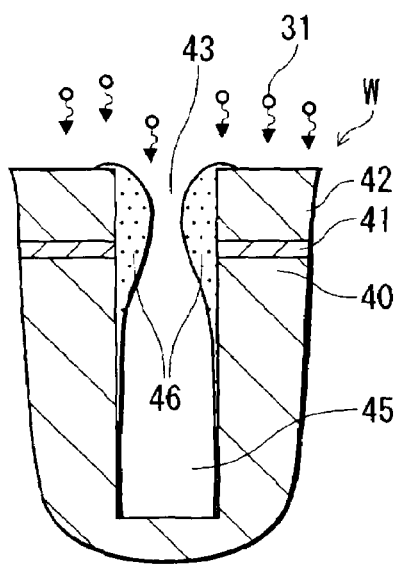

As shown in FIG. 2, first, in a dry etching apparatus (not shown), the wafer W in FIG. 4A is subjected to dry etching by plasma 44 produced from hydrogen bromide gas, so that the silicon base material 40 is etched (step S21) (dry etching step) (FIG. 3A). At this time, a trench 45 (concave portion) corresponding to the opening 43 is formed in the silicon base material 40, but silicon of the silicon base material 40 and the plasma 44 react with each other to produce SiOBr, which then accumulates on a side face of the opening 43 and a side face of the trench 45 to form an SiOBr deposit portion 46 (FIG. 3B). The SiOBr deposit portion 46 blocks most of the opening 43.

Next, the wafer W is transferred into the chamber 11 of the substrate processing apparatus 10, mounted on the mounting stage 12, and heated by the heater 18 to a temperature of not less than 200° C. (step S22) (heating step).

Then, as shown in FIG. 3B, hydrogen fluoride gas 31 and helium gas (not shown) are supplied from the shower head 13 toward the wafer W at flow rates of 2000 sccm to 3000 sccm and 100 sccm to 1000 sccm, respectively (step S23) (gas supplying step). The length of time that the hydrogen fluoride gas 31 is supplied is not more than 30 seconds. At this time, the SiOBr deposit portion 46 is removed by the hydrogen fluoride gas 31 through the chemical reactions expressed by the above equations (1) to (3), but because the temperature of the wafer W is not less than 200° C., the hard mask 42 and the silicon nitride film 41 are not removed. When the SiOBr deposit portion 46 has been removed, the silicon base material 40 becomes exposed on the side face of the trench 45 (FIG. 3C).

Figure 3C:
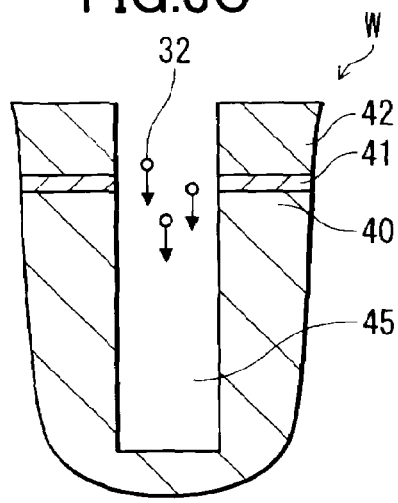
Figure 3D:
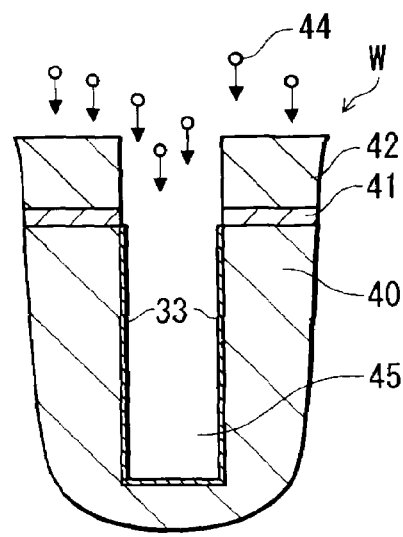

Then, as shown in FIG. 3C, oxygen radicals 32 are supplied toward the wafer W, more specifically, the interior of the trench 45 (step S24) (oxygen radical supplying step). The supplied oxygen radicals 32 react with silicon of the exposed silicon base material 40 to form a silicon oxide film 33 on the side face of the trench 45 (FIG. 3D). From the viewpoint of promoting the formation of the silicon oxide film 33, it is preferred that the temperature of the oxygen radicals 32 is 350° C. to 750° C.

Figure 3E:
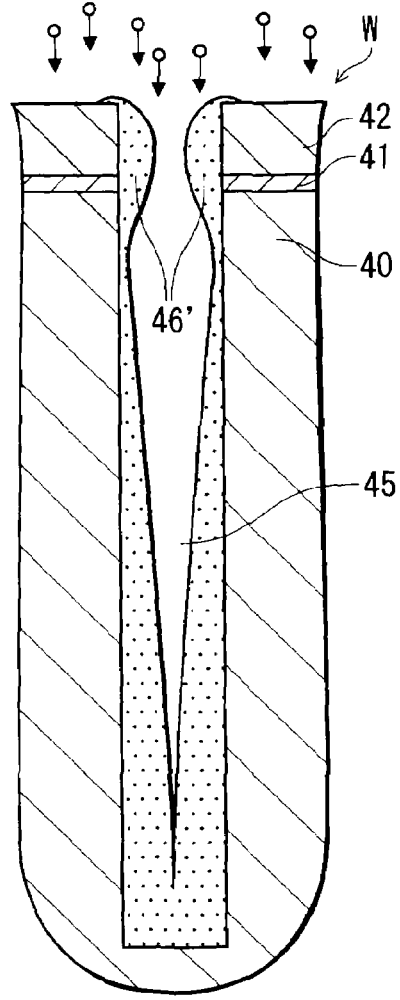

Then, in the above-mentioned dry etching apparatus, the wafer W is subjected again to the dry etching by the plasma 44, so that the silicon base material 40 is etched (step S25) (dry etching step) (FIG. 3D). At this time, because the SiOBr deposit portion 46 that blocks most of the opening 43 has already been removed, the path over which the plasma 44 passes through the opening 43 and enters the trench 45 can be secured. The plasma 44 that has entered the trench 45 etches the silicon base material 40, so that the trench 45 is further deepened (FIG. 3E). Although the plasma 44 that has entered the trench 45 may contact and etch the side face of the trench 45, the silicon oxide film 33 protects the side face of the trench 45 from the plasma 44. At this time, the silicon of the silicon base material 40 and the plasma 44 react with each other to form an SiOBr deposit portion 46' (FIG. 3E) as in the step S21.

Then, it is determined whether or not the depth of the trench 45 thus formed is more than a desired value (step S26). If the depth of the trench 45 is not more than the desired value, the process returns to the step S22, and if the depth of the trench 45 is more than the desired value, the process is terminated.

According to the process of FIG. 3, the wafer W in which the trench 45 corresponding to the opening 43 of the hard mask 42 has been formed in the silicon base material 40 through the dry etching using the plasma 44 produced from hydrogen bromide gas is heated to a temperature of not less than 200° C., and then the hydrogen fluoride gas 31 and the helium gas are supplied toward the wafer W. When the temperature of the wafer W rises to 200° C. or higher, the hydrogen fluoride gas 31 removes the SiOBr deposit portion 46 produced through the dry etching of the silicon base material 40, but does not remove the hard mask 42 made of BSG and the silicon nitride film 41. Thus, the SiOBr deposit portion 46 can be selectively removed.

According to the process of FIG. 3, after the hydrogen fluoride gas 31 and the helium gas are supplied, the wafer W is subjected again to the dry etching using the plasma 44. Specifically, because the wafer W is subjected to the dry etching after the hydrogen fluoride gas 31 and the helium gas are supplied to remove the SiOBr deposit portion 46 that blocks most of the opening 43, the path over which the plasma 44 passes through the opening 43 and enters the trench 45 can be secured. As a result, the silicon base material 40 can be etched again, and hence the trench 45 that is deep can be formed in the silicon base material 40.

Moreover, according to the process of FIG. 3, the oxygen radicals 32 are supplied toward the wafer W after the hydrogen fluoride gas 31 and the helium gas are supplied and before the dry etching is carried out again. When the SiOBr deposit portion 46 has been removed by the supplied hydrogen fluoride gas 31 and helium gas, the silicon base material 40 becomes exposed on the side face of the trench 45. The oxygen radicals 32 react with the exposed silicon base material 40 to form the silicon oxide film 33 on the side face of the trench 45. The silicon oxide film 33 protects the side face of the trench 45 from the plasma 44 used in the dry etching of the step S25. As a result, the trench 45 can be prevented from becoming deformed.

According to the process of FIG. 3, because the flow rate of the hydrogen fluoride gas 31 is 2000 sccm to 3000 sccm, a sufficient amount of hydrogen fluoride gas 31 can be supplied toward the wafer W, and hence the SiOBr deposit portion 46 can be reliably removed.

Moreover, according to the process of FIG. 3, the length of time that the hydrogen fluoride gas 31 is supplied during the supply of the hydrogen fluoride gas 31 and the helium gas is not more than 30 seconds. The absolute amount of SiOBr deposit portion 46 formed on the side face of the opening 43 and the like is relatively small, and hence the SiOBr deposit portion 46 can be removed through etching using the hydrogen fluoride gas 31 in a short time. Therefore, even if the length of time that the hydrogen fluoride gas 31 is supplied is not more than 30 seconds, the SiOBr deposit portion 46 can be reliably removed, and as a result, the throughput can be improved.

Although in the above described embodiment, the hard mask 42 is a film made of BSG, the hard mask 42 has only to be a film composed mainly of silicate containing impurities, for example, a film made of TEOS (tetra ethyl ortho silicate) or BPSG (boron phosphorous silicate glass). Also, the hard mask 42 may be a film made of silicon nitride.

Moreover, the plasma used for the dry etching of the silicon base material 40 is not limited to being the plasma 44 produced from hydrogen bromide, but rather may instead be plasma produced from halogenated gas. In this case, deposit to be removed through etching using the hydrogen fluoride gas 31 is not limited to being deposit comprised of SiOBr, but rather may instead be silicon oxide containing halogen, for example, SiOCl. Further, the concave portion formed through the dry etching of the silicon base material 40 is not limited to being the trench 45, but rather may instead be a hole, for example, a via hole.

It should be noted in the above described embodiments, the substrates are not limited to being semiconductor wafers W, but rather may instead be glass substrates used in LCDs (Liquid Crystal Displays), FPDs (Flat Panel Displays), or the like.

It is to be understood that the object of the present invention may also be accomplished by supplying a computer with a storage medium in which a program code of software, which realizes the functions of the above described embodiment is stored, and causing a CPU of the computer to read out and execute the program code stored in the storage medium.

In this case, the program code itself read from the storage medium realizes the functions of the above described embodiment, and hence the program code and the storage medium on which the program code is stored constitute the present invention.

Examples of the storage medium for supplying the program code include a RAM, an NV-RAM, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program code may be supplied to a computer by downloading from another computer, a database, or the like, not shown, connected to the Internet, a commercial network, a local area network, or the like.

Further, it is to be understood that the functions of the above described embodiment may be accomplished not only by executing a program code read out by a computer, but also by causing an OS (operating system) or the like which operates on a CPU to perform a part or all of the actual operations based on instructions of the program code.

Further, it is to be understood that the functions of the above described embodiment may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program may be an object code, a program executed by an interpreter, or script data supplied to an OS.

What is claimed is:

1. A method of processing a substrate having a silicon base material and a hard mask made of a silicon nitride film and/or a silicon oxide film and formed on the silicon base material, the hard mask having an opening to which the silicon base material is at least partially exposed, comprising:
    a dry etching step of forming a concave portion corresponding to the opening in the silicon base material using plasma produced from halogenated gas; and
    a deposit removing step of heating the substrate to a temperature of not less than 200° C. so that water molecules contained in the silicon nitride film and the hard mask are evaporated and so that water molecules contained in the deposit produced in said dry etching step remain and supplying hydrogen fluoride gas toward the substrate which has been heated so as to remove only the deposit through a reaction between the deposit and the hydrogen fluoride gas,
    wherein said deposit removing step is carried out after said dry etching step.

2. A method of processing a substrate according to claim 1, wherein a flow rate of the hydrogen fluoride gas supplied in said deposit removing step is 2000 sccm to 3000 sccm.

3. A method of processing a substrate according to claim 1, wherein a length of time that the hydrogen fluoride gas is supplied in said deposit removing step is not more than 30 seconds.

4. A method of processing a substrate according to claim 1, wherein deposit to be removed in said deposit removing step is deposit that is produced in said dry etching step and accumulates on a side face of the opening.

5. A method of processing a substrate according to claim 1, wherein the pressure in a chamber housing the substrate during said deposit removing step is $6.67\times10^2$ Pa to $2.67\times10^3$ Pa.

6. A method of processing a substrate according to claim 1, wherein said dry etching step is carried out again after said deposit removing step.

7. A method of processing a substrate according to claim 6, comprising an oxygen radical supplying step of supplying oxygen radicals toward the substrate before said dry etching step is carried out again after said deposit removing step.

8. A method of processing a substrate according to claim 7, comprising a determining step of determining whether or not the depth of the concave portion formed is more than a desired value after said dry etching step is carried out again.

9. A method of processing a substrate according to claim 7, wherein the temperature of the oxygen radicals supplied during the oxygen radical supplying step is 350° C. to 750° C.

\* \* \* \* \*